United States Patent [19]

Giunta et al.

[11] Patent Number: 4,943,966
[45] Date of Patent: Jul. 24, 1990

[54] MEMORY DIAGNOSTIC APPARATUS AND METHOD

[75] Inventors: Richard F. Giunta, Beverly; Robert D. Becker, Shirley; Martin J. Schwartz, Worcester; Richard W. Coyle, Dunstable; Kevin H. Curcuru, Pepperell, all of Mass.

[73] Assignee: Wang Laboratories, Inc., Lowell, Mass.

[21] Appl. No.: 179,162

[22] Filed: Apr. 8, 1988

[51] Int. Cl.⁵ .................. G11C 13/00; G06F 11/00
[52] U.S. Cl. .................. 371/11.1; 364/200; 364/245.3; 364/900; 364/970.1
[58] Field of Search .................. 371/10, 11; 364/200 MS File, 900 MS File

[56] References Cited

U.S. PATENT DOCUMENTS

| Re. 31,318 | 7/1983 | Kaufman et al. | 364/200 |
|---|---|---|---|
| 3,803,560 | 4/1974 | DeVoy et al. | 371/11 |
| 4,099,234 | 7/1978 | Woods et al. | 364/200 |
| 4,334,307 | 6/1982 | Bourgeis et al. | 371/16 |
| 4,435,754 | 3/1984 | Chow et al. | 364/200 |
| 4,479,214 | 10/1984 | Ryan | 371/11 |
| 4,485,471 | 11/1984 | Singh et al. | 371/11 |
| 4,527,251 | 7/1985 | Nibby, Jr. et al. | 364/900 |
| 4,532,628 | 7/1985 | Matthews | 371/13 |
| 4,566,102 | 1/1986 | Hefner | 371/11 |
| 4,608,690 | 8/1986 | Judge | 371/21 |

Primary Examiner—Charles E. Atkinson
Attorney, Agent, or Firm—Michael H. Shanahan; Gordon E. Nelson

[57] ABSTRACT

A system console 30 is enabled to read registers from memory boards 12 and 14 and to set registers within the memory boards which control the disabling of one or more memory arrays 16–22. The information read from the memory boards is indicative at least of which of the memory arrays has malfunctioned. The registers are within a memory logic array 40, one of which is disposed upon each of the memory boards 12 and 14 and also upon a memory controlling unit 26, the memory logic arrays being coupled together by a bit serial scan bus 42. In a preferred embodiment of the invention the memory logic arrays 40 are comprised of a highly integrated gate array semiconductor device, each of which is identical. Each memory logic array is provided with a base address input from a preceding memory logic array and computes a base address for a subsequent memory logic array. A memory logic array which has a portion of an associated memory disabled automatically determines a revised base address for the subsequent memory logic array, thereby initiating the automatic reallocation of memory board base addresses of all subsequent memory boards.

31 Claims, 4 Drawing Sheets

MEMORY DIAGNOSTIC APPARATUS AND METHOD

FIELD OF THE INVENTION

This invention relates generally to digital data processor memories and, in particular, to a distributed memory diagnostic system comprised of substantially identical memory logic arrays each of which is disposed upon a corresponding memory board and to a memory logic array disposed upon a memory control unit, the memory logic arrays being coupled together by a serial data bus.

BACKGROUND OF THE INVENTION

Modern computer systems are typically comprised of one or more memory boards and other system units, such as a central processing unit (CPU), which are coupled together by a system bus. The CPU is operable for storing data within and retrieving data from memory devices located on the memory boards. Each memory board is typically comprised of a number of dynamic read/write memory devices and may have a total memory storage capacity of many megabytes of digital data. For example, each memory board may have a total storage capacity of 16, 32, 64 or 128 megabytes of data. The range of storage location addresses which each board corresponds to are typically contiguously arranged within the address space of the system such that, for example, a first memory board may have a range of storage addresses of between zero and 16 megabytes while a second board may have a range of addresses between 16 and 32 megabytes.

As can be appreciated, a memory fault which results in a data storage error within a portion of the memory address space must be accurately identified as to the location within the address space. Related to this issue of identifying the portion of the address space having a faulty memory device is a problem related to the disabling of that portion of the memory to prevent the further occurrence of data storage errors A still further problem is introduced inasmuch as the disabling of a portion of the memory, which is preferably "mapped out" of the memory space, typically requires that a reallocation of memory addresses among the memory boards be accomplished to reflect the amount of memory which has been effectively removed from the address space of the system. Obviously, it is desirable that a minimum amount of operator or system intervention be required to reallocate the memory addresses in order to minimize or prevent system downtime and to avoid the possibility of erroneously reallocating the memory addresses.

SUMMARY OF THE INVENTION

The foregoing problems are overcome and other advantages are realized in a digital data processing system having, in accordance with invention, apparatus for allocating memory address base addresses among a plurality of memory units, each of the memory units defining a predefined range of memory addresses, each of the range of memory addresses also being contiguous one with the other. For each of the memory units there is disclosed means for defining a total number of data storage memory addresses represented by a memory unit, the total number defining means having a first output; means for defining a portion or portions of the total number of memory unit memory addresses which are disabled from the storage of data therein, the portion defining means having a second output; means for defining a memory address base address for the memory unit, the base address defining means having a third output; means for combining the first, the second and the third outputs to produce a fourth output, the fourth output being substantially equal to the sum of the first and the third outputs minus the second output; and means for outputting the fourth output to another memory unit for defining a memory address base address for the other memory unit.

In accordance with a method of the invention there is disclosed a method of allocating memory address base addresses among a plurality of memory units, each of the memory units defining a predefined range of memory addresses, each of the range of memory addresses also being contiguous one with the other. The method comprises the steps of, for each of the memory units, defining a first value expressive of a total number of data storage memory addresses represented by a memory unit; defining a second value expressive of a portion or portions of the total number of memory unit memory addresses which are disabled from the storage of data therein; defining a third value expressive of a memory address base address for the memory unit; combining the first, the second and the third values to generate a fourth value, the fourth value being substantially equal to the sum of the first and the third values minus the second value; and outputting the fourth value to another memory unit for defining a memory address base address for the other memory unit.

BRIEF DESCRIPTION OF THE DRAWINGS

These and other aspects of the invention will be made more apparent hereinafter in a description of a preferred embodiment of the invention read in conjunction with the accompanying drawing wherein.

DETAILED DESCRIPTION OF A PREFERRED EMBODIMENT

Figure 1:
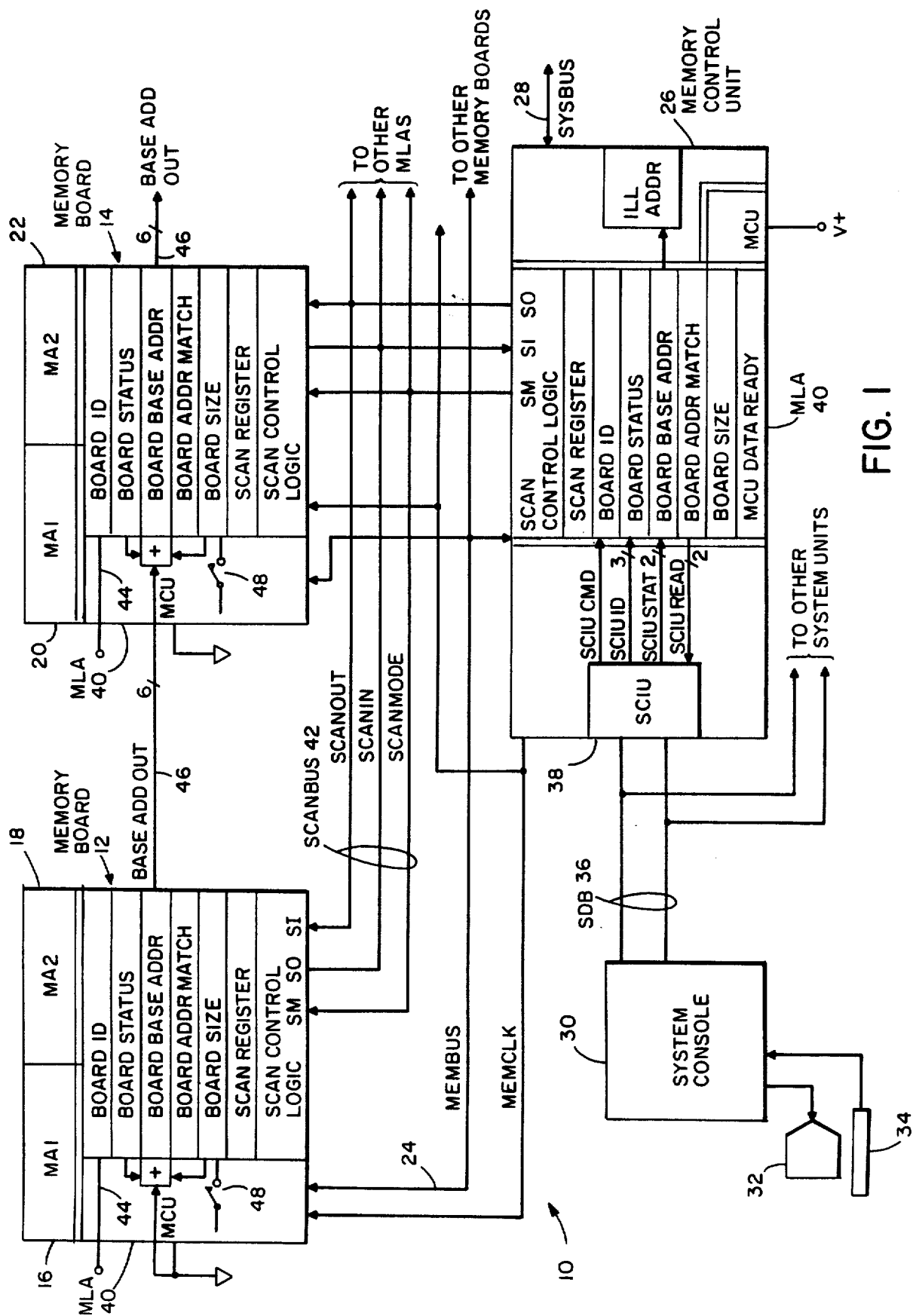
FIG. 1 is a block diagram of a portion of a computer system having a preferred embodiment of a memory logic array of the invention.

Referring now to FIG. 1 there is shown in block diagram form a portion of a digital data processing system 10 having a preferred embodiment of the invention. System 10 can be seen to be comprised of a plurality of discrete memory units, such as memory boards 12 and 14, each of which comprises first and second memory banks, or arrays, (MA) 16, 18 and 20,22, respectively. Each of the memory arrays 16-22 is comprised of some desired number of memory storage locations. For example each memory array may comprise sixteen megabytes of read/write memory, such as well known dynamic random access memory (DRAM). Each memory array 16-20 may be organized as double memory words each of which comprise eight bytes of data. For example, each memory word within a memory array may comprise eight bytes of data for a total word width of 64 bits of data. Of course, the system 10 may comprise more than two memory boards.

Address and data information are provided to the memory boards via a memory bus (MEMBUS) 24 which is sourced from a memory control unit (MCU) 26. Memory control unit 26 is coupled to a system address, control and data bus (SYSBUS) 28 and in general operates to interpret address and control information appearing on SYSBUS 28 which relates to data read/write operations to be performed upon one of the memory boards 12 or 14. Also coupled to the SYSBUS 28 are other system components such as a central processing unit CPU (not shown) and also typically one or more input/output (I/O) circuit boards (not shown).

The system 10 also comprises a system console 30 which may be a data processing system such as a personal computer or some other data processing system which is operable for monitoring the operation and status of the system 10. System console 30 typically comprises an operator output device such as a well known display monitor 32 and an operator input device such as a keyboard 34. By means of the display monitor 32 and keyboard 34 an operator is enabled to determine the status of the system 10 and to control various aspects of the operation thereof.

In the preferred embodiment of the invention the system console 30 is coupled to the system 10 via a serial diagnostic bus (SDB) 36 which comprises a bidirectional data signal line and a signal line which qualifies the content of the data signal line. The SDB 36 is preferably coupled to each of the major system units, such as the memory control unit 26, such that the system console is effectively coupled to substantially all of the major system units. The interface between the SDB 36 and each of the system units is accomplished by a system control interface unit (SCIU) 38.

In accordance with the invention the system console 30 is enabled to read status information from the memory boards 12 and 14 and to set registers within the memory boards which control the disabling of one or more of the MAs 16-22. The status information read from the memory boards is indicative at least of which of the MAs has malfunctioned. This valuable function is performed by a memory logic array (MLA) 40, one of which is disposed upon each of the memory boards 12 and 14 and also upon the MCU 26. In the preferred embodiment of the invention the MLAs 40 are comprised of a highly integrated gate array semiconductor device, each of which is identical. The specific function of each of the MLAs 40, that is whether the MLAs 40 function upon one of the memory boards or upon the MCU 26, is determined by the logical state of an MCU input. For example, if the MCU input is at a logic high the MLA 40 is configured to function upon the MCU 26. Conversely, if the MCU input is a logic low the MLA 40 is configured to function upon one of the memory boards 12 or 14.

Figure 2:
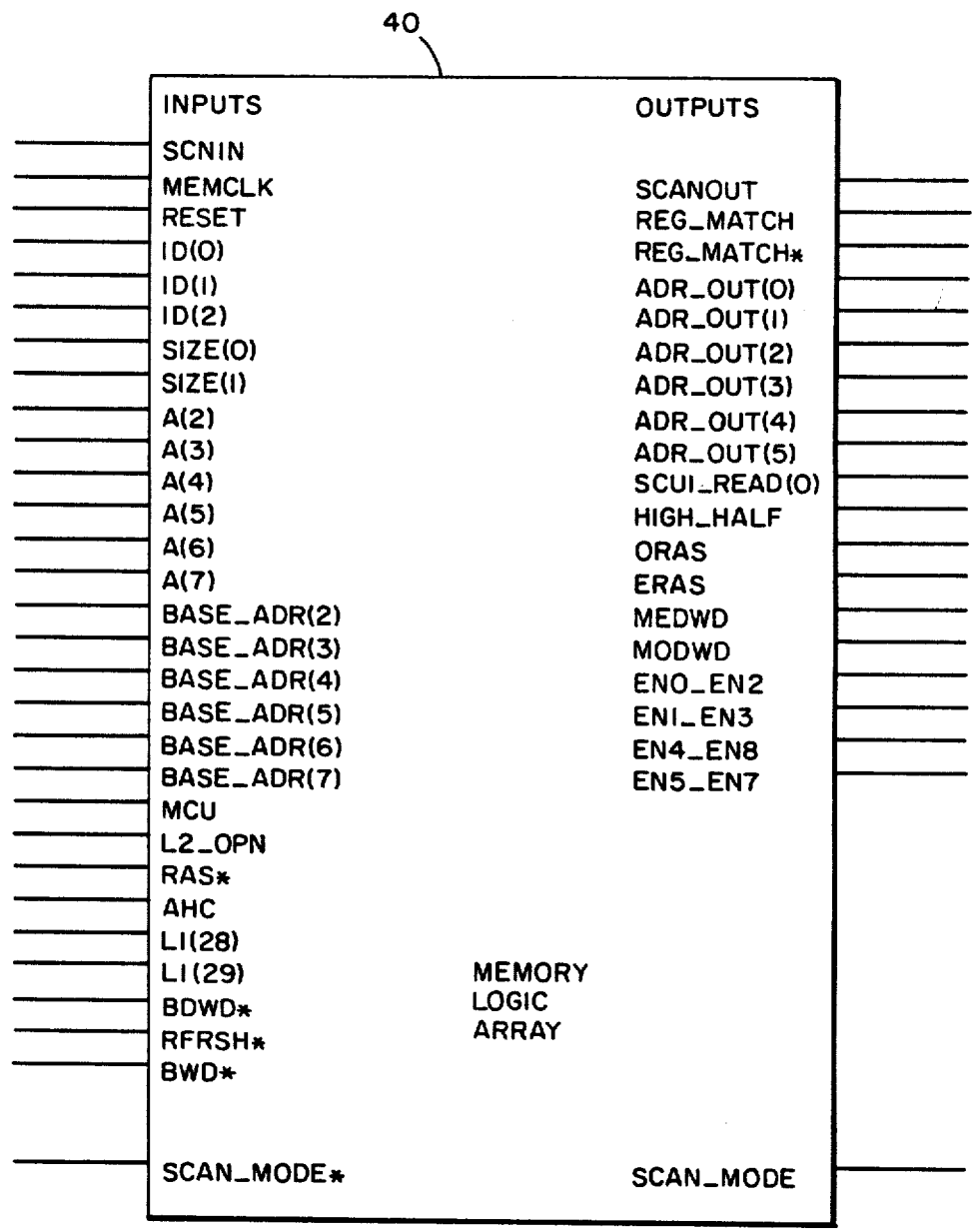
FIG. 2 is a block diagram of a memory logic array showing the input and output signals of the array.

FIG. 2 illustrates one of the MLAs 40 and shows the input and output terminals thereof. It should be pointed out that certain of the input/output terminals are coupled to MEMBUS 24 and that internal circuitry performs memory timing, memory array selection, memory access, refresh and other functions related to the general operation of the memory devices upon the associated memory board. For the MLA 40 upon MCU 26 these memory device control related pins are generally unused.

Communication between the MLAs 40 is accomplished by a scan bus (SCANBUS) 42 which comprises a SCANMODE signal line and bit serial SCANIN and SCANOUT signal lines. Synchronization of the internal operation of the MLAs 40 and the communication over the bit serial SCANBUS 42 is accomplished by a memory clock (MEMCLK) signal line which is coupled to each of the MLAs. In the preferred embodiment of the invention the MEMCLK signal has a period of approximately 38 nanoseconds. The MEMCLK signal is divided by four within each of the MLAs to provide the basic MLA operating clock frequency.

The direction of data flow upon the SCANBUS 42 is controlled by the logic state of the SCANMODE signal line. The logic state of SCANMODE specifies whether data is being sourced from the MLA 40 upon the MCU 26 or whether the data is being sourced by an MLA 40 upon one of the memory boards 12 or 14. The SCANOUT signal line from the MLA 40 upon the MCU 26 is connected in common to a SCANIN input pin of the MLAs 40 upon the memory boards. Conversely, the SCANOUT signal of each of the MLAs 40 upon the memory boards are coupled together in common and are further coupled to the SCANIN pin of the MLA 40 of MCU 26.

Communication between the MLAs is initiated by the MLA 40 upon the MCU 26 which in turn is controlled, via SCIU 38, by the system console 30.

The MLA on each memory board has five registers which contain information relating to the memory board. Board ID (BDID) is a register which is serially loaded from the SCANIN pin with a memory board ID and which is compared with data which is provided, typically, by input signals lines which are hardwired to predetermined signal levels. In the preferred embodiment of the invention BDID is three bits in width such that up to eight unique board IDs may be utilized. The three bits are hardwired to logic levels on a backplane to which the memory boards are coupled.

Board status (BDSTAT) is a register which is also serially loaded from the SCANIN pin and is used to indicate how much of the memory upon the memory board is to be disabled. BDSTAT is a one bit register which, in conjunction with the SCANIN signal, conveys information for enabling both MAs, disabling one or the other of the MAs, or provides for disabling both of the MAs. The contents of BDSTAT and the state of SCANIN are transferred to a pair of status flip/flops only within an MLA which detects a match between BDID and its externally provided ID.

Board base address (BDBA) is a register which holds the base address which a MLA provides to another MLA via base address output signal lines 46. In the preferred embodiment of the invention, each MLA outputs six signal lines which correspond to the MSBs of the memory address bus and in general have a value which is one greater than the maximum address which the MLA responds to. This base address thereby provides to the subsequent memory board the memory address at the beginning of the memory address range to which the subsequent board will respond. It can be appreciated that since memory boards preferably represent logically contiguous, partioned sections of the physical address space of the system that if a portion of the memory upon one of the memory boards is disabled that the base address output signal lines must change state to indicate the reduction in memory capacity of the memory board. As will be described, this change of state causes other "downstream" memory boards to automatically remap their corresponding range of memory addresses such that the congituous partitioning of the memory space is preserved. The base address input signal lines of the first memory board in the system, for example memory board 12, may be hardwired to desired logic signal levels. In the preferred embodiment of the invention these input signal lines are coupled to signal ground and thus the first memory board 12 responds to addresses within an address range of zero to the value determined by the setting of a plurality of board size jumpers 48, which will be discussed below.

Another register is board match (BDMATCH) which is a one bit register which indicates whether a memory address on MEMBUS 24 is a memory address which is within the range of addresses which a particular memory board responds to. That is, any particular memory access which occurs upon MEMBUS 24 will result in only one of the MLAs setting the BDMATCH register, that MLA being installed upon the memory board which responds to that particular memory address. BDMATCH is set by logic which compares the six MSBs of the address bus, which are input to each MLA on pins A[2:7], to logic signals which are related to the six base address inputs and the six base address outputs, in conjunction with logic signals related to the amount of memory which is enabled upon the memory board and also to the board size.

Another register is designated board size (BDSIZE) and is typically set by the externally provided switches 48 which indicate the amount of memory installed upon the memory board. In the preferred embodiment of the invention the board size register is two bits in width and assumes values which correspond to a board size, or memory capacity, of 16, 32, 64 or 128 megabytes. The value of the BDSIZE register is used in conjunction with circuitry, which will be described below, in order to determine the value of the base address output signal 46.

A scan register (SCANREG) holds data received by the MLA 40 upon the MCU 26 from the MLAs 40 on the memory boards 12 and 14, the data being received over SCANBUS 42. The MCU data ready register (MCUDR) is located within the MLA 40 of MCU 26 and is used to indicate that SCANREG has been fully loaded from a previously specified MLA 40 upon a memory board. The value of MCUDR is determined by the SCIU 38, in a manner which will be described hereinafter, in order to facilitate the transfer of data from the MLAs to the system console 30.

The aforementioned MCU input pin of each of the MLAs is utilized to determine the function of certain of the input lines of the MLA. When the logic state of the MCU input pin is high, the SCIU 38 provides control and data inputs to the MLA 40 upon the MCU 26 via the same input pins which are used for the base address and the board size in an MLA 40 upon one of the memory boards.

One of these inputs is SCIU Command (SCIU CMD) which is connected to one of the base address lines of the MLA 40 of MCU 26 and indicates, when high, that the MLA 40 is to scan the memory board specified by SCIU ID. SCIU ID is a three bit signal connected to three of the base address input lines and specifies the board ID of one of the memory boards whose M40 is to be scanned. Alternatively, when SCIU CMD is low SCIU ID specifies pairs of bits previously stored in SCANREG which are to be read out to the SCIU 38. The selected pairs of bits are read out to the SCIU 38 upon two SCIU READ signal lines.

When the logic state of the SCIU CMD specifies that a scan operation is to be performed a two bit signal SCIU STAT is provided to the MLA upon the BDSIZE input lines for inputting the two bit status code of the memory board to be scanned. The codes have the following meaning:

00, both MAs enabled;
01, the lower MA is disabled;
10, the upper MA is disabled; and
11, both MAs are disabled.

In general, the operation of the system is as follows. System console 30 maintains a record of the current status of each of the memory boards 12 and 14. This status information includes, for each memory board, whether both, one or neither of the memory arrays is enabled. When the system console 30 determines that a hardware memory error in a specific range of addresses has occurred, such as by the occurence of a noncorrectable double bit memory error, system console 30 scans the MLA 40 upon the memory boards to locate a memory board which includes the failing address or range of failing addresses. To accomplish this function, the system console 30 provides a memory board ID and a two bit code indicating the present status of that memory board via SDB 36 to SCIU 38. SCIU 38 thereafter sets SCIU CMD to indicate that a scan operation is to occur and subsequently places the desired board ID and that boards present status code onto the signal lines SCIU ID and SCIU STAT, respectively. In response to these signals the MLA 40 upon the MCU 26 performs a scan operation. First, MLA 40 serially outputs the contents of BDID and BDSTAT via the SCANOUT signal lines to all the MLAs 40 on the memory boards. As the contents of BDID and BDSTAT arrive at each of the MLAs 40 the MLAs serially input the ID data into their BDID registers and the status information into their BDSTAT registers. When these five bits of data have been inputted SCANMODE makes a transition from low to high, causing each MLA 40 on memory boards 12 and 14 to compare the received board ID value with the ID value indicated by signal lines. If a match occurs the MLA 40 on the specified memory board sets the two board status flip/flops from the value of BDSTAT and also sets a flip/flop which enables the MLA 40 to drive the SCANOUT signal line. Those MLAs not detecting a match between BDID and their ID inputs reset their SCANOUT enabling flip/flop, thereby ensuring that only one MLA is enabled to drive SCANOUT during any given scan. Of course, these nonselected MLAs do not change the state of their status flip/flops. During the initial scan of each of the MLAs the system console 30 preferably provides the current value of BDSTAT so that no change of state occurs in the selected MLA's status flip/flops.

Subsequent to the transmission of BDID and BDSTAT, the aforementioned change of state from low to high of SCANMODE indicates that data is to flow from the selected MLA 40 on the memory board to the MLA 40 on the MCU 26. The selected MLA 40 upon the memory board responds to the change of state of SCANMODE by serially outputting on SCANOUT the contents of BDBA (ADRREG[0:5]), BDMATCH, BDSIZE and BDID via the SCANIN signal line to the MLA 40 on MCU 26. In addition, the selected MLA first outputs an active low signal BRDINSLOT which is indicative, when asserted, that a memory board is physically installed within the addressed slot. If BRDINSLOT is later determined to be high the other data fields can be ignored. When the registers within the MLA 40 of MCU 26 have been loaded with this data, the MLA 40 on MCU 26 sets the MCUDR signal line to reflect the completion of the loading.

The following table summarizes the aforedescribed data transfers on a cycle by cycle basis. An "X" indicates that the data appearing on the associated pin is not relevant during the corresponding cycle.

| CYCLE | SCANOUT | SCANMODE | SCANIN | MCUDR |
|---|---|---|---|---|
| 10 | SCIUID[0] | 0 | X | 0 |
| 1 | SCIUID[1] | 0 | X | 0 |
| 2 | SCIUID[2] | 0 | X | 0 |
| 3 | SCIUSTAT[0] | 0 | X | 0 |
| 4 | SCIUSTAT[1] | 1 | BRDINSLOT | 0 |
| 5 | X | 1 | ADRREG[0] | 0 |
| 6 | X | 1 | ADRREG[1] | 0 |
| 7 | X | 1 | ADRREG[2] | 0 |
| 8 | X | 1 | ADRREG[3] | 0 |
| 9 | X | 1 | ADRREG[4] | 0 |
| 10 | X | 1 | ADRREG[5] | 0 |
| 11 | X | 1 | BDMATCH | 0 |
| 12 | X | 1 | BDSIZE[0] | 0 |
| 13 | X | 1 | BDSIZE[1] | 0 |
| 14 | X | 1 | BDID[0] | 0 |
| 15 | X | 1 | BDID[1] | 0 |
| 16 | X | 1 | BDID[2] | 0 |
| 17 | X | 0 | X | 1 |

SCIU 38 typically polls the value of MCUDR to determine when these values have been loaded and thereafter serially scans out of the MLA 40 on MCU 26, two bits at a time, the values of these registers. The data is subsequently transferred via SDB 36 to the system console 30.

In general, if a memory error occurred because a memory board did not respond to a memory access, as opposed to an access which resulted in, for example, a double bit error, this occurrence will be indicated by the value of BDMATCH. That is, if an address was provided on MEMBUS 24 which a memory board should have responded to but did not, BDMATCH being low will indicate that this response did not occur.

The following table illustrates the logical states of the SCIU ID signal lines and the corresponding data appearing on the SCIU READ data lines. SCIU CMD is assumed to be low.

| SCIU ID | SCIU READ[0] | SCIU READ[1] |
|---|---|---|
| 000 | MCUDR | BRDINSLOT |
| 001 | ADRREG[0] | ADRREG[1] |
| 010 | ADRREG[2] | ADRREG[3] |
| 011 | ADRREG[4] | ADRREG[5] |
| 100 | BDMATCH | BDSIZE[0] |
| 101 | BDSIZE[1] | BDID[0] |
| 110 | BDID[1] | BDID[2] |
| 111 | X | X (reset MCUDR) |

By sequentially scanning the memory boards coupled to MEMBUS 24 in the above described manner, the system console 30 identifies, at least from BDBA and BDSIZE, which memory board and which memory array thereon includes the address or range of addresses at which the failure occurred.

Having determined which of the memory boards and which portion thereof has malfunctioned, system console 30 thereafter again initiates a scan of the MLA 40s as previously described. However, during this subsequent scan the BDSTAT of the MLA 40 on the defective memory board is changed to disable the malfunctioning memory array(s). When the MLA 40 on the defective memory board scans in the revised status information the MLA 40 determines a new value for BDBA, thereby decreasing the value of BDBA by an amount equal to the amount of the memory which has been disabled. That is, the system console 30 scans the MLA 40 and sets BDSTAT as required by that memory board. The MLAs 40 on subsequent memory boards automatically determine the address ranges for their associated memory boards in the newly reconfigured memory address space. This is accomplished by each MLA 40 changing the state of the base address output signal lines such that an adjacent MLA in the sequential chain of MLAs determines a new value for its base address output signal. After scanning the last memory board a system address having a value greater than the highest address corresponding to installed memory will be indicated by the base address output signal lines of MLA 40 on MCU 26. This value is preferably utilized as an illegal address threshold value against which incoming addresses associated with a memory request are compared.

Figure 3:
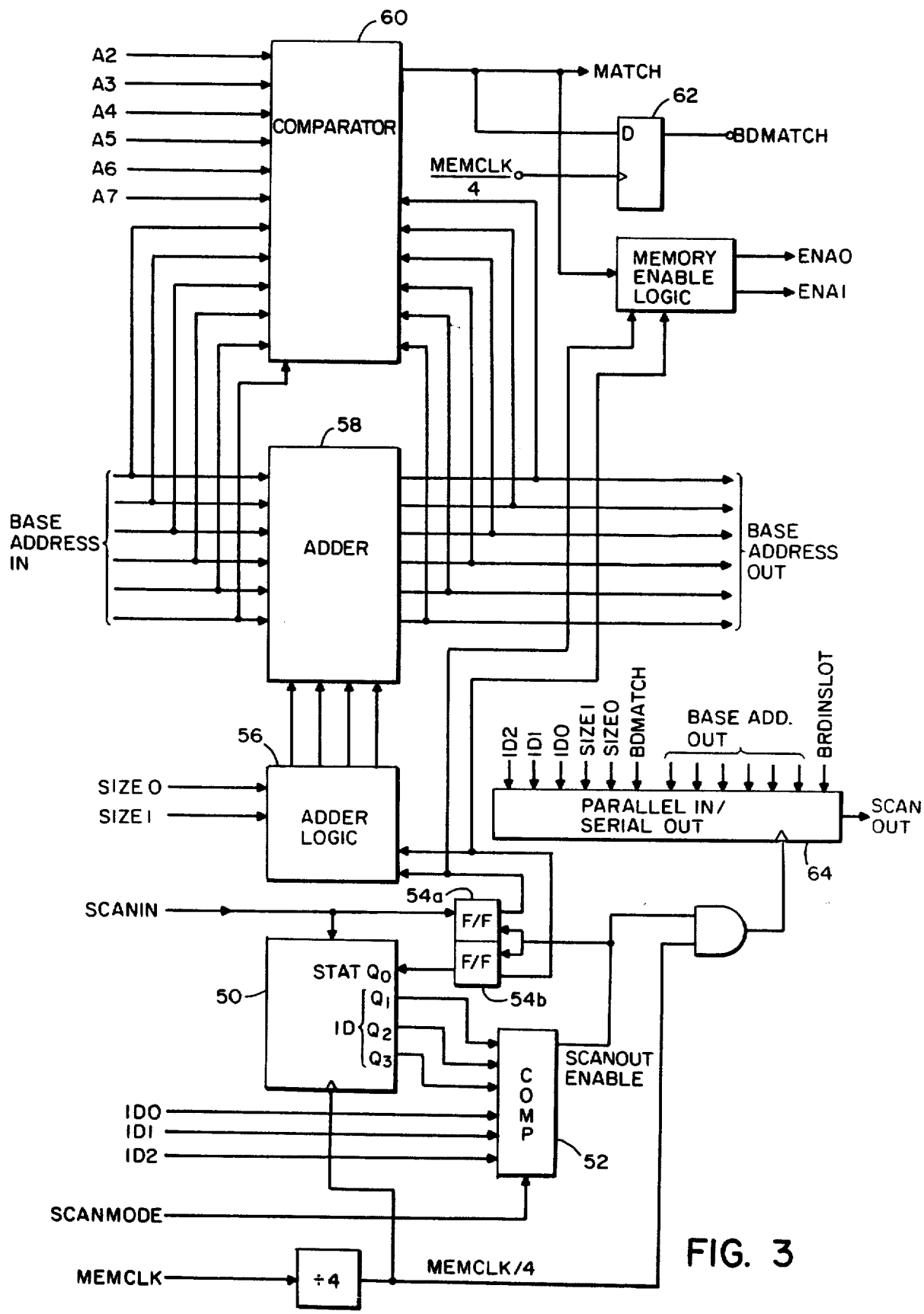
FIG. 3 is a block diagram of circuitry which comprises a portion of the memory logic array of FIG. 2, the circuitry functioning in a memory array board application.

Referring now to FIG. 3 there is shown a block diagram of a portion of the circuitry within one of the MLAs; specifically that circuitry which is utilized on an MLA 40 upon one of the memory boards 12. In FIG. 3 it can be seen that the MEMCLK/4 input is divided by four to provide a MEMCLK/4 signal which is utilized for internal timing within the MLA. The SCANIN pin is coupled to the input of a serial data reception means, such as a shift register 50, the register being clocked with MEMCLK/4. Data sourced from the MLA 40 upon MCU 26 is clocked into shift register 50 until four bits of data have been so clocked in. After transmitting the fifth bit of data the state of the SCANMODE pin is changed by the MLA 40 from a logic zero to a logic one which enables a comparison of the board ID inputs with the board ID clocked in. This comparison is accomplished by a comparison means, such as a comparator 52, which has as an output a signal SCANOUT ENABLE. In addition, the two BDSTAT signals are clocked into storage means, such as status flip/flops 54a and 54b. The status outputs of flip/flops 54a and 54b are combined with the BDSIZE inputs in an ADDER logic block 56 which has outputs which are provided to an adding means, such as an ADDER circuit 58. ADDER circuit 58 also has as inputs the base address input signal lines. As previously described, these input signal lines for the MLA 40 on memory board 12 may be a logic zero and for other MLAs are a function of the base address output signals of a previous MLA. ADDER 58 effectively adds output signals from the ADDER logic block 56 to the base address input signal lines to provide the six base address output signal lines. The base address output signal lines are thus greater than the base address input signal lines by an amount equal to board size less the amount of memory which is disabled, as indicated by the status flip/flops.

The MLA 40 also comprises an address comparison means, such as a comparator 60, which compares the address inputs A2-A7 from MEMBUS 24 to determine if the A2-A7 address signal lines correspond to a range of addresses upon the memory board. A2-A7 are typically the MSBs of the memory address bus. Address comparator 60 has a MATCH output which is true if the A2-A7 address inputs indicate that the addressed memory location is upon the corresponding memory board. BDMATCH is the registered version of the MATCH output and is stored within a flip/flop 62. The MATCH output is utilized, in conjunction with memory enable logic 63, to initiate an access to memory devices within a given memory array as defined by the address and control signal lines which comprise MEMBUS 24. If one or both of the outputs of status flip/flops 54a or 54b are set access to the corresponding memory array is disabled.

The SCANOUT ENABLE signal being true indicates that the MLA has been addressed by the MLA upon the MCU 26. The addressed MLA thereafter drives onto its SCANOUT signal line the values of the various internal signals as previously described. This is accomplished in part by a parallel to serial conversion means 64, which may comprise a sequential chain of flip/flops and multiplexers.

The SCANOUT signal line is connected, as previously described, to the SCANIN pin of the MLA 40 upon the MCU 26.

Figure 4:
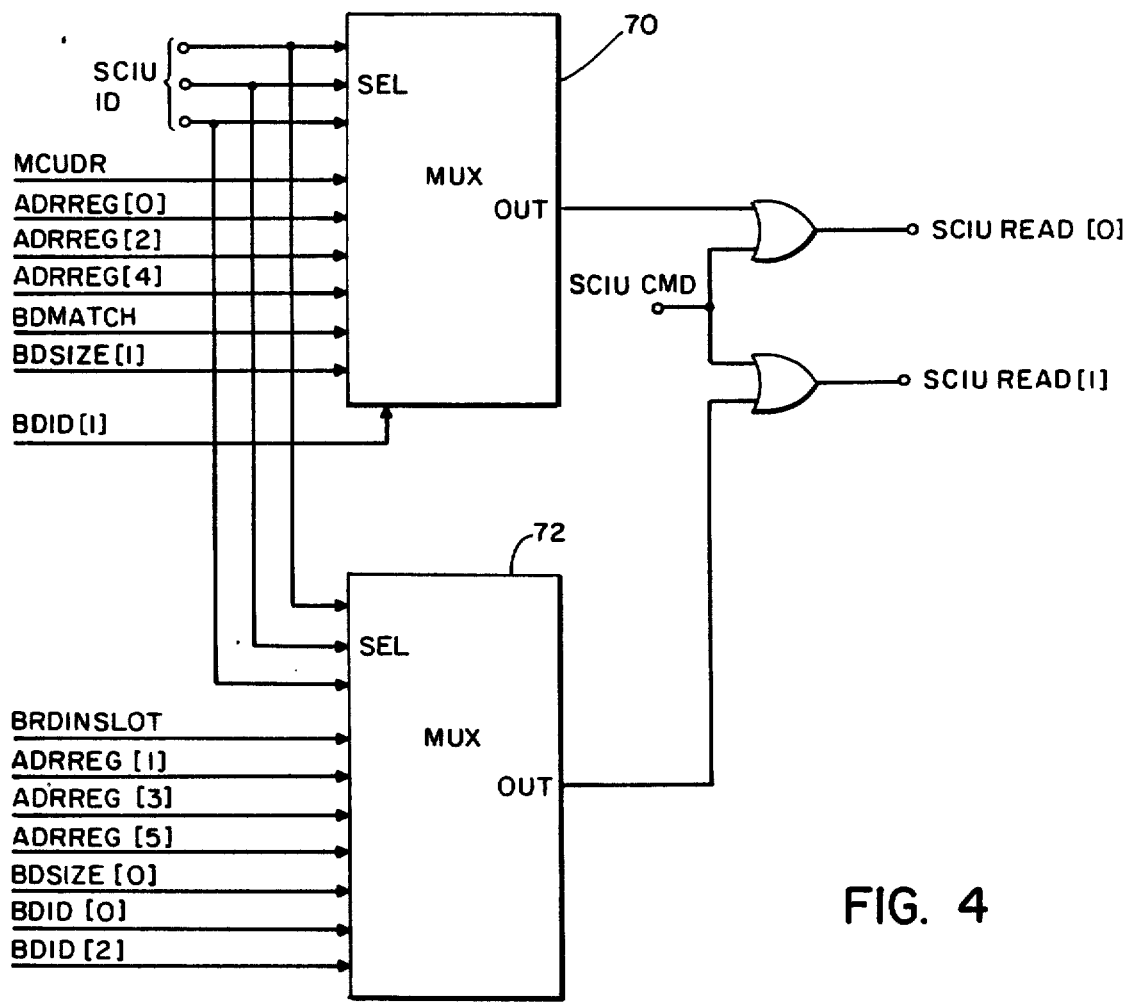
FIG. 4 is a block diagram of circuitry which comprises a portion of the memory logic array of FIG. 2, the circuitry functioning in a memory controller application.
Figure 4:
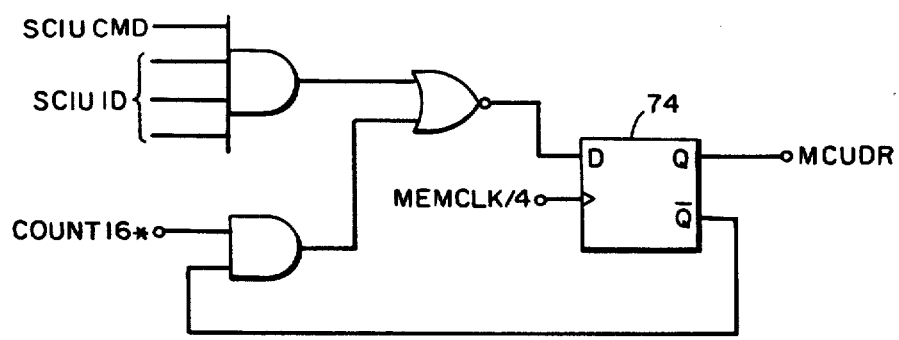

Referring now to FIG. 4 there is shown circuitry operable for implementing the transmission of data from the MLA 40 on MCU 26 to the SCIU 38. A pair of multiplexers 70 and 72 each have selection inputs coupled in common to the SCIU ID signal inputs and a plurality of data inputs coupled to register outputs of MLA 40; the register outputs reflecting the data previously scanned in from a selected MLA 40 on one of the memory boards. Multiplexers 70 and 72 each have an output which is gated with SCIU CMD to provide signals SCIU READ[0] and SCIU READ[1], the state of which reflect the selected data input to multiplexers 70 and 72 when SCIU CMD is low.

As can also be seen, the MCUDR signal may be generated by a flip/flop 74 which is clocked with MEMCLK/4 and which has as a set input a COUNT16* signal derived from a counter. Flip/flop 74 is reset by the aforedescribed SCIU ID code 111 asserted in conjunction with SCIU CMD being low.

It should be realized that a presently preferred embodiment of the invention has been presented and that modifications to this embodiment may occur to those having skill in this art. For example, although the MLA 40 of the presently preferred embodiment is comprised of a highly integrated gate array semiconductor device the invention may be equally well realized by a number of circuit means, including discrete integrated circuit devices such as multiplexers, flip/flops and gates. Furthermore, although the invention has been described in the context of a system console coupled by a serial diagnostic bus to a SCIU device for interfacing to the MLA 40 on MCU 26 it can be appreciated that any suitable means may be employed for interfacing to the MLA 40. For example, the MLA 40 upon MCU 26 may be directly coupled to I/0 pins of a microprocessor device or to logic devices configured for inputting and receiving data from the MLA 40 in accordance with the protocol described above.

Thus, the method and apparatus of the invention is not to be considered to be limited to the presently preferred embodiment described above, the invention is instead meant to be limited only as defined by the appended claims.

What is claimed is:

1. Apparatus for allocating memory address base addresses among a plurality of memory units, each of the memory units defining a predefined range of memory addresses, each of the range of memory addresses being contiguous one with the other, comprising for each of the memory units;
    means for defining a total number of data storage memory addresses represented by a memory unit, said total number defining means having a first output;
    means for defining a portion or portions of said total number of memory unit memory addresses which are disabled from the storage of data therein, said portion defining means having a second output;
    means for defining a memory address base address for said memory unit, said base address defining means having a third output;
    means for combining said first, said second and said third outputs to produce a fourth output, said fourth output being substantially equal to the sum of said first and said third outputs minus said second output; and
    means for outputting said fourth output to another memory unit for defining a memory address base address for the other memory unit.

2. Apparatus as defined in claim 1 and further comprising for each of the memory units:
    means for outputting an address expressive of a desired data storage address;
    means for comparing said input address to said third and to said fourth outputs to determine if the input address is within a range of addresses defined by said third and said fourth outputs; and
    means, responsive to the operation of said comparing means, having a match output for indicating when said input address is within said range of addresses.

3. Apparatus as defined in claim 2 and further comprising identification means having an output for defining, for each of said memory units, an identification code unique to each of said memory units.

4. Apparatus as defined in claim 3 and further comprising for each of the memory units;
    means for receiving data from a memory unit controlling means, said received data being expressive of at least one of said identification codes, said received data further being expressive of a portion or portions, if any, of memory addresses to be disabled upon the memory unit identified by said received identification code;

means for comparing said received identification code to said output of said identification means for generating a selection output signal; and means, responsive to said selection output signal, for transmitting data to said memory unit controlling means.

5. Apparatus as defined in claim 4 wherein said transmitted data comprises data fields expressive of:
   said fourth output;
   said match output;
   said first output; and
   said identification means output.

6. Apparatus as defined in claim 5 wherein said apparatus comprises an integrated circuit device and wherein individual ones of said devices are disposed upon each of said memory units.

7. Apparatus as defined in claim 6 wherein said memory unit controlling means comprises one of said devices.

8. Apparatus as defined in claim 7 wherein each of said devices are coupled together by a data communication bus comprising:
   a first signal line, driven by said device on said memory control unit means, for defining whether data is to flow from said device on said memory control unit means to said devices on said memory units or is to flow from one of said devices on said memory units to said device on said memory control unit means;
   a second signal line, driven by said device on said memory control unit means, coupled to an input of said data receiving means for transmitting data to said devices on said memory units; and
   a third signal line coupled to an output of each of said data transmitting means for transmitting said data fields from a selected one of said devices on said memory units to said device on said memory control unit means.

9. Apparatus as defined in claim 8 wherein each of said devices is coupled to a synchronizing clock signal and wherein data transmission upon said second and said third signal lines is a bit serial data transmission which occurs substantially synchronously with said clock signal.

10. Apparatus as defined in claim 5 wherein said memory unit controlling means comprises means for defining a data storage memory address which is greater than a maximum data storage address of said memory units.

11. A method of allocating memory address base addresses among a plurality of memory units, each of the memory units defining a predefined range of memory addresses, for each of the memory units comprising the steps of:
   defining a first value expressive of a total number of data storage memory addresses represented by a memory unit;
   defining a second value expressive of a portion or portions of the total number of memory unit memory addresses which are disabled from the storage of data therein;
   defining a third value expressive of a memory address base address for the memory unit;
   combining the first, the second and the third values to generate a fourth value, the fourth value being substantially equal to the sum of the first and the third values minus the second value;
   outputting the fourth value to another memory unit for defining a memory address base address for the other memory unit.

12. A method as defined in claim 11 and further comprising the steps of:
   inputting an address expressive of a desired data storage address;
   comparing the input address to the third and to the fourth values to determine if the input address is within a range of addresses defined by the third and the fourth values; and
   responsive to the operation of the comparing means, generating a match output signal for indicating if the input address is within the range of addresses.

13. A method as defined in claim 12 and further comprising a step of defining, for each of the memory units, an identification code unique to each of the memory units.

14. A method as defined in claim 13 and further comprising the steps of:
   receiving data from a memory unit controlling means, the received data being expressive of
   at least one of the identification codes, the received data further being expressive of a portion or portions, if any, of memory addresses to be disabled upon the memory unit identified by the received identification code;
   comparing the received identification code to the defined identification code for generating a selection output signal; and
   responsive to the selection output signal, transmitting data to the memory unit controlling means.

15. A method as defined in claim 14 wherein the step of transmitting data is accomplished by transmitting data fields expressive of:
   the fourth value;
   the match output signal;
   the first value; and
   the defined identification code.

16. In a digital data processing system comprising a plurality of memory units each of which is coupled by a memory bus to a memory unit controlling means, the memory unit controlling means being coupled to a system bus for decoding address and control signals of said system bus for controlling memory accesses to said memory units, each of said memory units having a plurality of data storage addresses organized into one or more banks of data storage locations, the data storage addresses of each of said memory units being contiguous to another logically adjacent memory unit, apparatus for selectively disabling one or more of said banks of data storage locations comprising:
   for each of said memory units
   means for storing data defining which one or ones, if any, of said banks of data storage locations are disabled from storing data;
   means for defining an identifying code for uniquely identifying said memory unit from others of said memory units;
   means for receiving data from said memory unit controlling means, said received data being expressive of a memory unit identifying code and data expressive of which one or ones, if any, of said banks of data storage locations are to be disabled upon a memory unit associated with said received identifying code;
   means, coupled to said data receiving means and to said identifying code defining means, for comparing said received and said defined identifying codes to determine a match therebetween; and means coupled to said data receiving means and to an output of said comparison means, for transferring and storing within said data storing means said received data which is expressive of which one or ones of said banks of data storage locations are to disabled upon said memory unit.

17. Apparatus as defined in claim 16 and further comprising:

means for defining a maximum number of data storage locations of said memory unit;

means for inputting a signal indicative of a base memory address for said memory unit;

means, coupled to said maximum number defining means, said bank data storing means and to said inputting means, for generating a value expressive of a base memory address of a logically contiguous memory unit; and means for outputting the generated value to the inputting means of said logically contiguous memory unit.

18. Apparatus as defined in claim 17 and further comprising:

means, coupled to said data receiving means and to said output of said comparison means, for transmitted data to said memory unit controlling means, said transmitted data comprising data fields expressive at least of:

said generated base memory address value;

said defined maximum number of data storage locations; and said defined identifying code.

19. Apparatus as defined in claim 16 wherein said digital data processing system further comprises a system console communicatively coupled to said memory unit controlling means, said apparatus further comprising:

means for bidirectionally coupling said system console to said memory unit controlling means for receiving data from said system console and for transmitting data to said system console; wherein the data received from said system console comprises data fields expressive at least of an identifying code of one of said memory units and a status code expressive of which one or ones, if any, of said memory banks is disabled on the memory unit associated with said identifying code; and wherein the data transmitted to said system console comprises data fields expressive at least of the data received from the identified memory unit.

20. In a digital data processing system comprising a plurality of memory units each of which is coupled by a memory bus to a memory unit controlling means, the memory unit controlling means being coupled to a system bus for decoding address and control signals of said system bus for controlling memory accesses to said memory units, each of said memory units having a plurality of data storage addresses organized into one or more banks of data storage locations, the data storage addresses of each of said memory units being contiguous to another logically adjacent memory unit, the processing system further comprising a system console bidirectionally coupled to said memory unit controlling means, a method for selectively disabling one or more of said banks of data storage locations comprising the steps of:

for the system console:

detecting the occurrence of a memory error at an address location within the range of address locations defined by the memory units; and outputting to the memory unit controlling means a memory unit identification code and status data expressive of one or more banks, if any, of data storage locations which are currently disabled upon the memory unit;

for the memory unit controlling means:

outputting in a simultaneous manner to each of the memory units the identification code and status data;

for each of the memory units comparing the identification code to a predefined identification code to determine a match therebetween;

for a memory unit detecting a match outputting to the memory unit control means a plurality of data fields expressive at least of:

the base memory address of a logically contiguous memory unit;

the number of data storage locations which comprise the memory unit; and the identification code of the memory unit;

for the memory unit control means:

receiving the data transmitted from the identified memory unit; and transmitting the received data to the system console;

for the system console:

receiving the data transmitted from the memory unit control means; and determining if the address location of the memory error is within a range of addresses upon the presently identified memory unit as determined from the base address data field and from the number of storage locations data field;

if the memory error is so determined to be within the presently identified memory unit:

identifying a memory bank having the memory error; and outputting to the memory unit control means the identified memory unit identification code and a revised status data being expressive of one or more banks of data storage locations which are to be disabled upon the identified memory unit;

for the memory unit controlling means:

outputting in a simultaneous manner to each of the memory units the identification code and the revised status data;

for each of the memory units:

comparing the identification code to the predefined identification code to determine a match therebetween; and for a memory unit detecting a match:

storing data expressive of the revised status data whereby a memory bank having the data error is disabled.

21. A method as defined in claim 20 and further comprising the steps of:

for the memory unit storing data expressive of the revised status data:

generating a revised base memory address for a logically contiguous memory unit, the revised base memory address being decreased by an amount substantially equal to the number of data storage locations within the disabled memory bank;

outputting the revised base memory address to the logically contiguous memory unit such that the logically contiguous memory unit is enabled to generate a revised base memory address for another memory unit.

22. In a digital data processing system comprising one or more memory units for storing digital data, the memory units being interconnected during operation with a memory control unit, each of the memory units comprising in combination:
- at least one memory array comprising data storage means; and
- a first bus coupling the memory unit to the memory control unit for transferring at least memory addresses from the memory control unit to the memory array;
- the memory unit further comprising:
- a second bus coupling the memory unit to the memory control unit, the second bus comprising:
- a first bit serial signal line for transferring, when active, information from the memory control unit to the memory unit;
- a second bit serial signal line for transferring, when active, information from the memory unit to the memory control unit; and
- a third signal line for conveying either a first logical state for indicating that the first bit serial signal line is active or a
- second logical state for indicating that the second bit serial signal line is active.

23. A memory unit as defined in claim 22 wherein each memory unit further comprises a first memory logic array coupled to said second bus and responsive to the state of the third signal line for receiving information from and for transmitting information to the memory control unit, the memory control unit comprising a second memory logic array coupled to said second bus for receiving information from and for transmitting information to the first memory logic array unit.

24. A memory unit as defined in claim 23 wherein said first memory logic array comprises:
- first means for determining a total storage capacity of the memory unit;
- second means for determining a base memory address of the memory unit; and
- third means, coupled to the first and the second means, for determining a base memory address of another memory unit.

25. A memory unit as defined in claim 24 wherein the information received by the first memory logic array from the second memory logic array is information related to the disabling of a portion or portions of the data storage means, the information being provided to a memory disabling means.

26. A memory unit as defined in claim 25 wherein the information related to the disabling of a portion or portions of the data storage means is determined by a system console means, the information being provided by the system console means over a third bus to a system console interface means within the memory control unit, the system console interface means being coupled to the second memory logic array for providing the information thereto.

27. A memory unit as defined in claim 25 wherein the third means is further coupled to the memory disabling means and wherein the determined base memory address of another memory unit is decreased by an amount substantially equal to the amount, if any, of a disabled portion or portions of the data storage means.

28. A memory unit as defined in claim 26 wherein the third bus comprises a pair of bit serial signal lines.

29. In a digital data processing system comprising a plurality of memory units each of which is coupled by a memory bus to a memory unit controlling means, the memory unit controlling means being coupled to a system bus for decoding address and control signals of said system bus for controlling memory accesses to said memory units, each of said memory units having a plurality of data storage addresses organized into one or more banks of data storage locations, the data storage addresses of each of said memory units being contiguous to another logically adjacent memory unit, said digital data processing system including a system console means and further comprising:
- bus means for bidirectionally coupling said system console means to said memory unit controlling means for receiving data from said system console means and for transmitting data to said system console means; wherein
- the data received from said system console means comprises data fields expressive at least of an identifying code of one of said memory units and a status code expressive of which one or ones, if any, of said memory banks is disabled on the memory unit associated with said identifying code; and wherein
- the data transmitted to said system console means comprises data fields expressive at least of a data received by said memory unit controlling means from the identified memory unit.

30. In a digital data processing system comprising a plurality of memory units each of which is coupled by a memory bus to a memory unit controlling means, the memory unit controlling means being coupled to a system bus for decoding address and control signals of said system bus for controlling memory accesses to said memory units, each of said memory units having a plurality of data storage addresses organized into one or more banks of data storage locations, the data storage addresses of each of said memory units being contiguous to another logically adjacent memory unit, the processing system further comprising system console means bidirectionally coupled to said memory unit controlling means, apparatus for selectively disabling one or more of said banks of data storage locations comprising:
- means for detecting the occurrence of a memory error at an address location within the range of address locations defined by the memory units; and
- means for outputting from the system console means to the memory unit controlling means a memory unit identification code and status data expressive of one or more banks, if any, of data storage locations which are currently disabled upon the memory unit;
- means for outputting from the memory unit controlling means to each of the memory units in a simultaneous manner the identification code and status data;
- each of the memory units including means for comparing the identification code to a predefined identification code to determine a match therebetween; and
- means responsive to the operation of the comparison means determining a match, for outputting to the memory unit controlling means a plurality of data fields expressive at least of:

the base memory address of a logically contiguous memory unit;

the number of data storage locations which comprise the memory unit; and the identification code of the memory unit;

the memory unit controlling means further comprising means for receiving the data transmitted from the memory unit; and means for transmitting the received data from the memory controlling means to the system console means;

the apparatus further comprising means for receiving at the system console means the data transmitted from the memory unit controlling means;

means for determining if the address location of the memory error is within a range of addresses upon the presently identified memory unit as determined from the base address data field and from the number of storage locations data field;

means for identifying a memory bank having the memory error; and means for outputting from the system console means to the memory unit controlling means the identified memory unit identification code and a revised status data expressive of one or more banks of data storage locations which are to be disabled upon the identified memory unit;

means for outputting in a simultaneous manner from the memory unit controlling means to each of the memory units the identification code and the revised status data; and means for comparing the identification code to the predefined identification code to determine a match therebetween; and each of the memory units further comprising means, responsive to the operation of the comparison means determining a match, for storing data expressive of the revised status data whereby a memory bank having the data error is disabled.

31. Apparatus as defined in claim 30 wherein each of the memory units further comprises:

means for generating a revised base memory address for a logically contiguous memory unit, the revised base memory address being decreased by an amount substantially equal to the number of data storage locations within the disabled memory bank; and means for outputting the revised base memory address to the logically contiguous memory unit such that the logically contiguous memory unit is enabled to generate a revised base memory address for another memory unit.

* * * * *